United States Patent [19]

Gentsch et al.

[11] Patent Number: 5,212,449

[45] Date of Patent: May 18, 1993

[54] RESONATOR FOR ELECTRON SPIN RESONANCE SPECTROSCOPY

[75] Inventors: Ekkehard Gentsch, Karlsruhe; Dieter Schmalbein, Marxzell-Burbach, both of Fed. Rep. of Germany

[73] Assignee: Bruker Analytische Messtechnik GmbH, Fed. Rep. of Germany

[21] Appl. No.: 847,899

[22] Filed: Mar. 6, 1992

[30] Foreign Application Priority Data

Mar. 9, 1991 [DE] Fed. Rep. of Germany ....... 4107630

[51] Int. Cl.$^5$ ............................................. G01R 33/20
[52] U.S. Cl. ................................... 324/316; 333/227; 324/636
[58] Field of Search ............... 324/316, 318, 636, 632; 333/227, 230, 219

[56] References Cited

U.S. PATENT DOCUMENTS 3,214,684 10/1965 Everitt ................................ 324/318
3,358,180 12/1967 Jolly ..................................... 333/227
3,458,808 7/1969 Agdur .................................. 333/227
4,446,429 5/1984 Froncisz et al. .................... 324/316

Primary Examiner—Michael J. Tokar
Assistant Examiner—Raymond Y. Mah
Attorney, Agent, or Firm—Rosenblum, Parish & Isaacs

[57] ABSTRACT

A resonator is provided for electron spin resonance spectroscopy. The resonator comprises walls defining a cavity. In the cavity, a predetermined oscillation mode of a preselectable frequency, in particular in the Q band, is capable of propagating. The walls are provided with an opening for irradiating a radiation, in particular light rays. The cavity has a cylindrical shape. An oscillation mode of the type $TE_{01n}$ is excited, with n being greater than one. The opening is configured as an annular slot extending substantially all around the cylindrical jacket, which defines the cavity, in a radial plane at a distance of m L/4 from a radial end wall delimiting the cavity, and m is an odd number and greater than one (FIG. 2).

6 Claims, 2 Drawing Sheets

RESONATOR FOR ELECTRON SPIN RESONANCE SPECTROSCOPY

The present invention relates to a resonator for electron spin resonance spectroscopy having walls defining a cavity in which a predetermined oscillation mode of a preselectable frequency, in particular in the Q band, is capable of propagating, and the walls are provided with an opening for irradiating a radiation, in particular light rays. A resonator of the type described above is generally known.

In electron spin resonance spectroscopy, one frequently carries out measurements which require that the measuring sample is treated with a radiation during the measurement. A typical example of such instances are measurements on free radicals in liquids, which are produced in the liquid during the measurement by irradiating upon the sample liquid a high-energy radiation, for example a UV radiation. It is understood that in addition to this case, which has been mentioned by way of example only, there are numerous other possibilities of subjecting solid, liquid or gaseous samples to radiations of the most different kinds, for the purpose of carrying out electron spin resonance measurements under the effect of these rays.

In designing resonators for such elements, relatively little technical problems are encountered when the dimensions of the resonator are sufficiently big for correspondingly low microwave frequencies (for example in the S or X band) so that the necessary passage openings for the radiation can be applied in a relatively simple way, mechanically. However, once measurements have to be carried out at higher microwave frequencies, for example in the 0 band, i.e. above 30 GHz, mechanical and constructional problems are encountered because the resonator dimensions get correspondingly small, for wavelengths in the range of 8 mm, so that it becomes difficult to arrange the necessary passage openings for the radiation. It has to be considered in this connection that every opening in the resonator wall will disturb the field pattern because any opening in the resonator wall constitutes an imperfection interfering with the wall currents which are coupled to the field lines of the respective oscillation mode. In addition, if the passage openings get very small, it will be difficult to bundle and to adjust the beam as required, quite apart from the fact that in the case of very small passage openings the introduction of the desired radiation energy into the sample material will also present a problem.

Although Q-band resonators, which enable a sample located in the resonator to be irradiated, have been known before, these known resonators are not suited for all applications.

Now, it is the object of the present invention to improve a resonator of the type described above in such a way that a sufficiently big passage opening is available for external irradiation of the sample during electron spin resonance measurements, even in cases of very high microwave frequencies.

This problem is solved for a resonator of the before-described type by the fact that the cavity is given a cylindrical shape, that an oscillation mode of the type $TE_{01n}$ is excited, with n being greater than one, and that the opening is configured as an annular slot extending substantially all around the cylindrical jacket, which defines the cavity, in a radial plane at a distance of m L/4 from a radial end wall delimiting the cavity, with m being an odd number and greater than one.

This solves the object underlying the present invention fully and perfectly. Given the fact that the opening is configured as an annular slot extending substantially all around the cavity, a sufficiently big passage opening is provided to enable sufficient radiation energy to be introduced into the sample substance, by means of one or more beams of the radiation. In addition, the invention provides the advantage that due to the arrangement of an annular slot in the manner described above, the wall currents and the electric field pattern will be disturbed only minimally so that the electric properties of the resonator are maintained practically unchanged. The use of an oscillation mode of the type $TE_{01n}$, wherein n is greater than one, for example an oscillation mode of the type $TE_{012}$, provides the additional advantage to make available a larger resonator volume and to enable for example the cavity to be coupled in a period of the oscillation mode different from the irradiation of the beam through the annular slot.

In a preferred embodiment of the resonator according to the invention, the cylindrical jacket comprises an electrically non-conductive tube, in particular a ceramic or glass tube, with a thin layer of a conductive material applied thereon.

This feature provides the advantage that the mechanical stability of the resonator can be ensured, in spite of the slot extending all around the jacket, by making the tube of a material which, while being permeable to the respective radiation, is electrically non-conductive so that the annular slot is in fact produced only electrically, not mechanically or optically, with respect to the radiation.

It is particularly preferred in the case of the embodiment just described if the layer is applied to the tube by plating. This feature provided the advantage that no expensive coating processes are required, provided the tube used has a sufficiently precise surface. The electrically conductive layer can then be produced by applying leaf gold, leaf silver, leaf brass, or the like, in which case no excessive demands have to be placed on the precision of the application process because, given the extremely small depth of penetration of RF currents in the range of some GHz, the mechanical quality of the layer must be guarantied only in the direct neighborhood of the surface.

Other advantages of the invention will appear from the specification and the attached drawing.

It is understood that the features that have been described before and will be explained hereafter may be used not only in the described combinations, but also in any other combination, or individually, without leaving the scope and intent of the present invention.

One embodiment of the invention will now be described in more detail with reference to the drawing in which.

Figure 1:
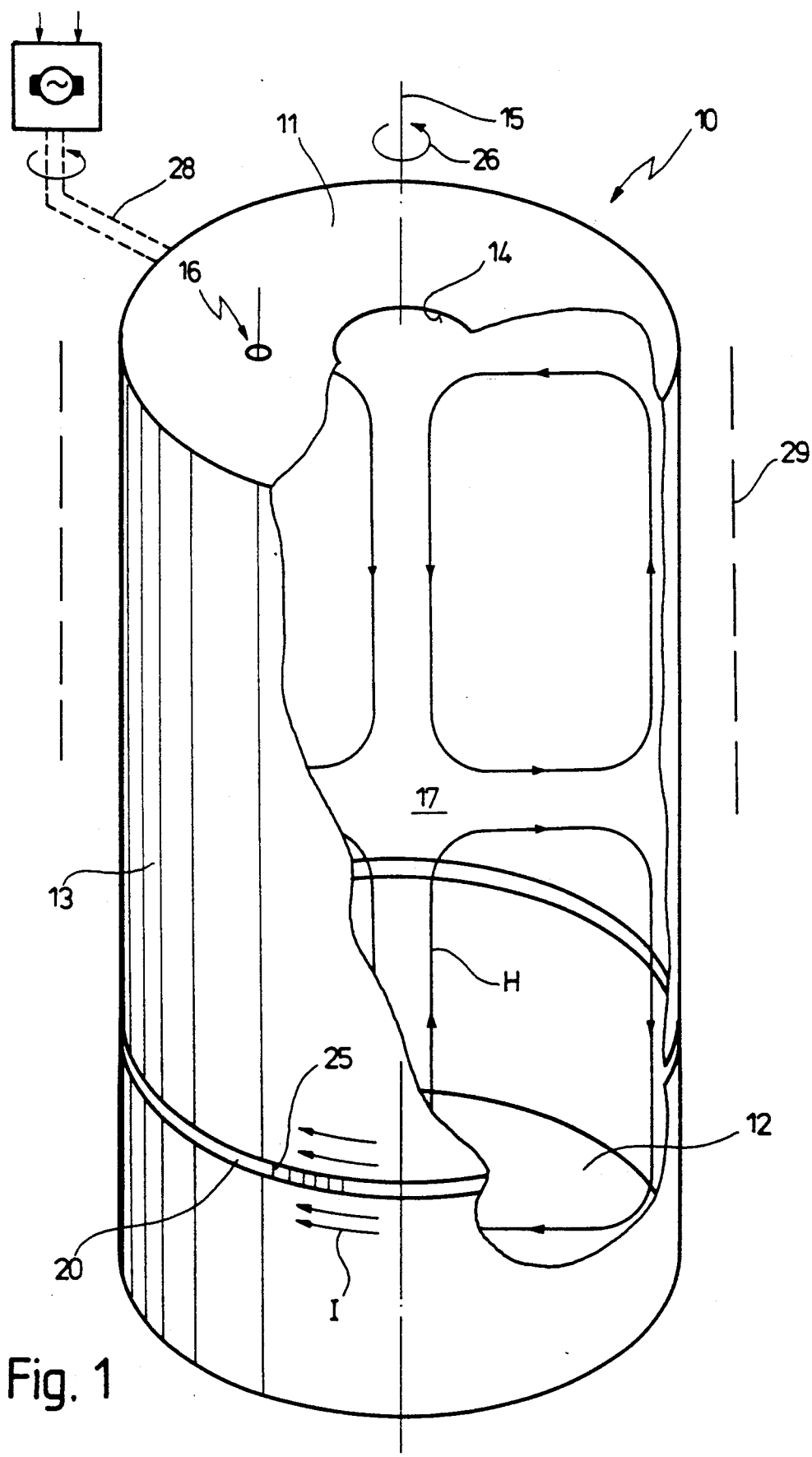
FIG. 1 shows a perspective, partly cross-sectional view of one embodiment of a resonator according to the invention.

In the FIGURES, one embodiment of a resonator according to the invention is indicated generally by 10. The resonator 10 exhibits a cylindrical configuration. It is delimited at its top and at its bottom by circular end walls 12, 11 and about its circumference by a cylindrical jacket 13. The upper end wall 11 is provided with a sample opening 14 through which a sample can be introduced. The walls 11, 12 and 13 define by their particular shape a longitudinal axis 15.

Reference numeral 16 indicates very diagrammatically a coupling arrangement by means of which an electromagnetic wave can be coupled into the cavity 17, which is defined by the walls 11 to 13. In the illustrated embodiment, the coupling arrangement 16 comprises substantially a loop-shaped antenna, but it is understood that other coupling arrangements known to the man skilled in the art, for example iris diaphragms or the like, may be used as well. The resonator 10 is designed in such a way that an oscillation mode of the type $TE_{01n}$ is capable of propagating at the desired measuring frequency. In a particularly preferred embodiment of the invention, the resonator 10 is designed for a microwave frequency in the Q band, i.e. above 30 GHz. In the illustrated embodiment, an oscillation mode of the type $TE_{012}$ is excited in the resonator 10 so that two closed field line zones of the magnetic RF field H are generated one above the other in axial direction.

The circumference of the cylindrical jacket 13 of the resonator 10 is provided with an annular slot 20 extending substantially all around the jacket. The annular slot 20 defines a radial plane relative to the longitudinal axis 15. The annular slot 20 has a width of approximately 1.5 to 2.0 mm. Consequently, it is very much wider than conventional slots of the type used, for example, in order to prevent the generation of eddy currents which may be induced in the electrically conductive walls of the resonator by modulation errors. It must be noted at this point that the width of 1.5 to 2.0 mm is independent of the microwave measuring frequency used. On the other hand, a slot of such a width is far less disturbing for a measuring frequency in the X band, with a wavelength of approximately 30 mm, than for for a measuring frequency in the Q band, with a wavelength of 8 mm, for example, because in the Q band the width of the slot already equals ¼ of the length of the measuring wave. Consequently, one cannot simply transfer known arrangements of the type used in the X band to arrangements used at higher frequencies, in particular in the Q band.

If the overall length of the resonator 10, measured in the direction of the longitudinal axis 15, is described as L, then the radial plane defined by the annular slot 20 is provided at a distance of L/4 from the lower end wall 12 in the illustrated example.

Expressed in general terms, the resonator 10 according to the invention is designed for oscillation modes of the type $TE_{01n}$. The radial plane defined by the annular slot 20 must in this case be located at a distance of m L/4 from the two end walls 11, 12, with m being an odd number and greater than or equal to one.

Figure 2:
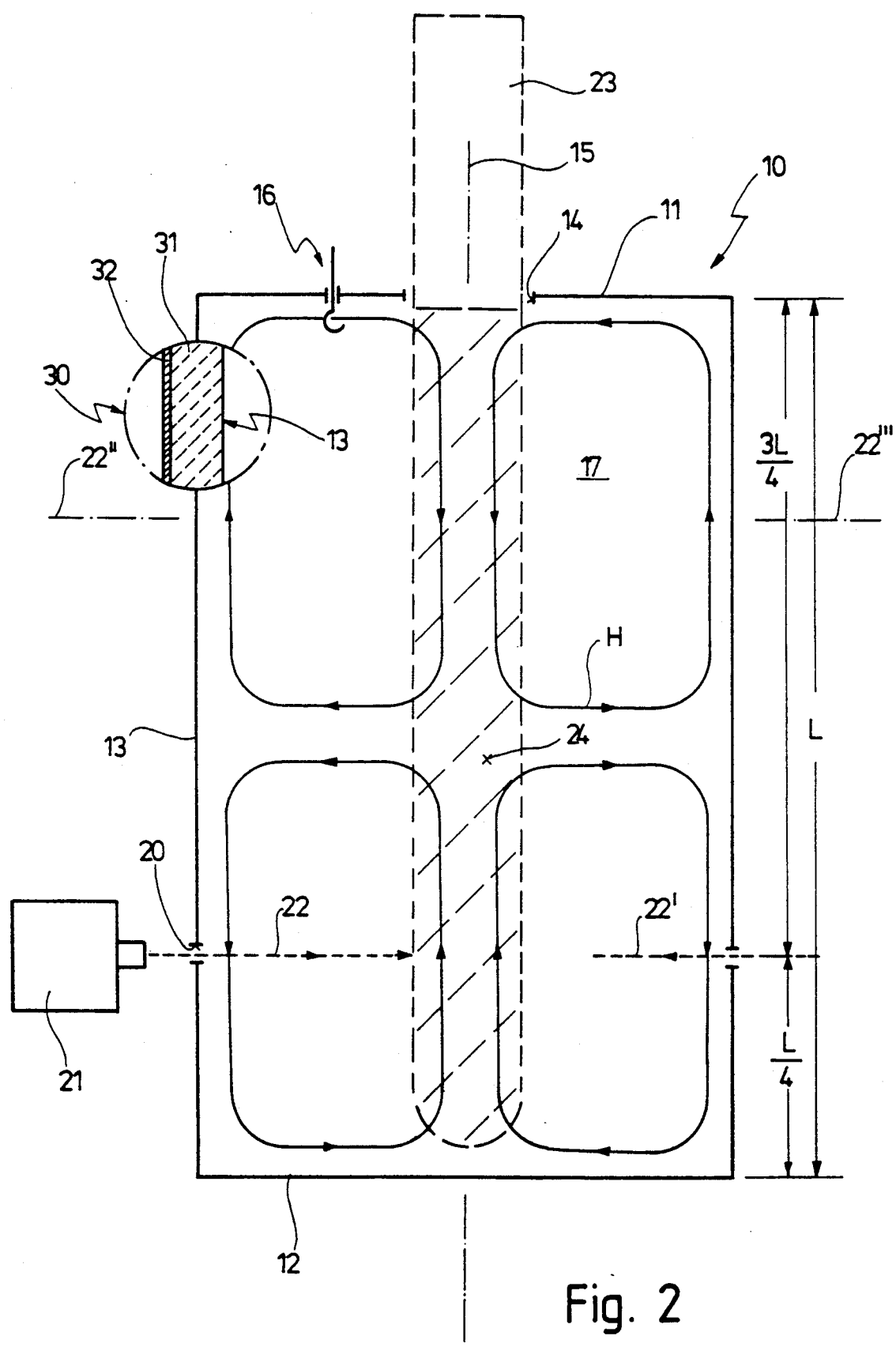
FIG. 2 shows a vertical section through the resonator illustrated in FIG. 1.

If the oscillation mode used is of the type $TE_{01n}$, and in particular of the type $TE_{012}$, then the respective partial modes can be used for different purposes. In the case of a $TE_{012}$ resonator, as illustrated in FIG. 2, the upper mode may be used, for example, for excitation, the lower mode for measuring purposes. The elements used on the one hand for excitation and on the other hand for measuring purposes, therefore, do not influence each other so that the symmetry of the arrangement is maintained.

If, therefore, the annular slot 20 is arranged at a distance of L/4 from the lower end wall 12, as illustrated in FIG. 2, this means that the annular slot 20 is in fact located in the maximum of the wall currents (compare FIG. 2), but on the other hand the annual slot 20 with its finite width is arranged symmetrically relative to that maximum, so that on the whole the symmetry of the wall currents 1 is not disturbed, even though the wall currents 1 are displaced in part on either side of the annular slot 20 (but this symmetrically). Consequently, the annular slot can be made rather wide, and this even in the presence of very high measuring frequencies, in particular in the Q band, without thereby disturbing the symmetry of the field propagation in the resonator 10.

In FIG. 1, the direction of the wall currents produced in a cylindrical resonator at the oscillation type $TE_{01n}$ are indicated by I. It will be noted that the wall currents flow in the circumferential direction of the cylindrical jacket 13 so that they are not affected by the annular slot 20. As is generally known, there do not occur any axially directed wall currents in the case of oscillation type $TE_{01n}$.

In FIG. 2, a radiation source, for example a laser or a UV light source, is indicated by 21. The radiation source 21 emits a ray 22 which passes the annular slot 20 and impinges upon a sample vessel 23 containing a sample substance 24. The sample substance 24 may consist, for example, of a liquid or a solid body, for example a glass, in which free radicals and/or color centers can be produced under the effect of high-energy radiation, which are then usually examined by the electron spin resonance method.

Reference numerals 22', 22" and 22''' in FIG. 2 are used to indicate that the annular slot can be passed by rays 22 at several points, by either irradiating the rays at different points spaced about the circumference of the annular slot 20, or by providing a plurality of annular slots 20 at the stated distance from the end walls 11, 12, which are then passed by rays 22, 22', 22" and 22''', respectively.

FIG. 1 illustrates still other advantageous improvements of the invention. Arrow 26, for example, indicates that the resonator 10 can be rotated about its longitudinal axis 15 for the purpose of carrying out anisotropy measurements on crystals. This can be effected by a drive 27 and an active connection 28, which are indicated in FIG. 1 only diagrammatically. Further, the resonator 10 preferably is arranged in a cryostat which is indicated in FIG. 1 by reference numeral 29. The cryostat 29 is provided with a window at the level of the annular slot 20 so that the radiation source 21 (FIG. 2) can direct its rays into the annular slot 20 through this window. Given the fact that the annular slot 20 extends all around the resonator 10, the resonator 10 with the sample, in particular an anisotropic crystal, fixed therein can be rotated about the axis 15, in the direction indicated by arrow 26, without having to interrupt the irradiation of the sample.

Further, reference numeral 25 indicates in FIG. 1 that the annular slot 20 can be bridged fully or in part by axially extending rods interconnecting the two sides of the annular slot 20.

Finally, the detail in FIG. 2 indicated at 30 illustrates a cross-section through the cylindrical jacket 13, in greatly enlarged scale.

The cylindrical jacket 13 consists of a tube 31, for example a ceramic or glass tube, which is permeable to the particular radiation emitted by the radiation source 21.

The tube 21 is provided with a conductive coating 32. In the illustrated embodiment, the layer is applied to the outside of the tube 31, which requires that the material of the tube must have low dielectric losses in the microwave field. Otherwise, it would also be possible to apply the conductive layer 32 to the inner face of the tube 31.

In both cases, the conductive layer 32 may be applied by plating, for example by applying leaf gold, leaf silver, leaf copper, or the like. It is only necessary for this purpose to cover the tube 31 in the known manner with extremely thin leaves of the desired metal, and to press the leaves upon the material, which will already result in a mechanically stable connection, by adhesion alone, whereafter the connection can be additionally reinforced by suitable fixing processes.

Claims

1. Resonator for electron spin resonance spectroscopy having walls being arranged in the form of a cylindrical jacket defining a cavity of cylindrical shape, said cavity being delimited by two radial end walls, the distance of which defining the total length L of the resonator, wherein in said cavity a predetermined oscillation mode of a preselectable frequency in the Q band of the type $TE_{01n}$, with n being greater than one, is excited, and wherein said walls are provided with an opening for admitting radiation said opening being configured as an annular slot extending substantially all around the cylindrical jacket, and being arranged in a radial plane at a distance of $mL/4$ from either one of said two radial end walls delimiting said cavity, with m being an odd number and greater than or equal to one.

2. Resonator according to claim 1, wherein said cylindrical jacket comprises an electrically non-conductive tube, with a thin layer of a conductive material applied thereon.

3. Resonator according to claim 2, wherein said layer is applied to said tube by plating.

4. Resonator according to claim 1, wherein said radiation is light rays.

5. Resonator according to claim 2, wherein said tube is made of ceramic.

6. Resonator according to claim 2, wherein said tube is made of glass.

* * * * *